United States Patent [19]

Whitten et al.

[11] Patent Number: 5,451,811

[45] Date of Patent: Sep. 19, 1995

[54] ELECTRICALLY PROGRAMMABLE INTERCONNECT ELEMENT FOR INTEGRATED CIRCUITS

[75] Inventors: Ralph G. Whitten, San Jose; Amr Mohsen, Saratoga, both of Calif.

[73] Assignee: Aptix Corporation, San Jose, Calif.

[21] Appl. No.: 260,688

[22] Filed: Jun. 16, 1994

Related U.S. Application Data

[63] Continuation of Ser. No. 29,800, Mar. 10, 1993, abandoned, which is a continuation of Ser. No. 774,531, Oct. 8, 1991, abandoned.

[51] Int. Cl.⁶ .................. H01L 27/02; H01L 23/48
[52] U.S. Cl. .................. 257/530; 257/208; 257/209; 257/529; 257/750
[58] Field of Search ............ 257/208, 209, 529, 530, 257/750

[56] References Cited

U.S. PATENT DOCUMENTS

| | | | |
|---|---|---|---|
| 4,441,167 | 4/1984 | Principi | 365/94 |
| 4,758,745 | 7/1988 | Elgamal et al. | 307/465 |
| 4,796,075 | 1/1989 | Whitten | 357/51 |
| 4,823,181 | 4/1989 | Mohsen et al. | 357/51 |
| 4,847,732 | 7/1989 | Stopper et al. | 361/395 |
| 4,870,302 | 9/1989 | Freeman | 307/465 |
| 4,894,705 | 1/1990 | Kamuro | 357/71 |
| 4,899,285 | 2/1990 | Nakayama et al. | 364/453 |
| 4,908,692 | 3/1990 | Kikuchi et al. | 357/51 |
| 4,912,066 | 3/1990 | Wills | 437/173 |
| 4,947,020 | 8/1990 | Imamura et al. | 219/121.65 |
| 4,968,643 | 11/1990 | Mukai | 437/174 |
| 5,017,510 | 5/1991 | Welch et al. | 437/192 |
| 5,070,384 | 12/1991 | McCollum et al. | 357/51 |

FOREIGN PATENT DOCUMENTS 0416903  3/1991  European Pat. Off. ... H01L 21/320

*Primary Examiner*—Rolf Hille
*Assistant Examiner*—Valencia Martin Wallace
*Attorney, Agent, or Firm*—D'Alessandro & Ritchie

[57] ABSTRACT

A user-programmable interconnect device includes a first lower electrode comprising a conductive material. A layer of dielectric material is disposed over the top surface of the lower conductor. An antifuse material, such as one or more layers of a dielectric material, amorphous silicon, or combinations of such materials, is located in an aperture in the dielectric material where the interconnect element of the present invention is to be formed. A second, upper electrode of conductive material is formed over the top of the antifuse material. A portion of the upper electrode located immediately above the antifuse material is fabricated as a fuse material. A passivation layer covers the second electrode and may have an aperture located therein at a location immediately above the antifuse and fuse material. Electrical connections to circuitry incorporating the interconnect element of the present invention are made to the lower and upper electrodes.

23 Claims, 5 Drawing Sheets

ELECTRICALLY PROGRAMMABLE INTERCONNECT ELEMENT FOR INTEGRATED CIRCUITS

CROSS-REFERENCE TO RELATED APPLICATIONS

This is a continuation of U.S. patent application Ser. No. 08/029,800, filed Mar. 10, 1993, now abandoned, which was, in turn, a continuation of U.S. patent application Ser. No. 07/774,531, filed Oct. 8, 1991, now abandoned.

BACKGROUND OF THE INVENTION

1. Field of the Invention

The present invention relates to integrated circuit technology. More particularly, the present invention relates to electrically programmable interconnect technology and to an electrically programmable interconnect element suitable for fabrication as a part of a fabrication process for integrated circuits, hybrids, multichip modules, and interconnect structures on insulating or conductive substrates and the like.

2. The Prior Art

Numerous schemes for providing integrated circuit interconnections are known in the prior art. Various ones of these schemes relate to electrically programmable interconnections for use in integrated circuits, wherein a plurality of potential interconnection points are fabricated into an integrated circuit during the manufacturing process, but the particular interconnections between circuit nodes in the integrated circuit are made by the user by electrically programming selected ones of the interconnections such that desired connections between circuit nodes are made while other potential interconnections are deliberately unrealized.

There are several types of electrically programmable interconnect schemes which are currently available to the integrated circuit user. One type of electrically programmable interconnect is reprogrammable, and can be altered by a user after initial circuit configuration has been accomplished. This type of interconnect may be implemented by simple transistors whose gate voltages are controlled to determine the interconnections to be made, or by one form or another of non-volatile memory devices, such as EPROMS, EEPROMS, NOVRAMS, or combinations of both simple transistors and non-volatile memory elements. An example of a technology for implementing this type of interconnect is found in U.S. Pat. No. 4,870,302 to Freeman.

Another type of electrically programmable interconnection is onetime programmable, and once initially configured, may not be reconfigured. The most popular examples of type of electrically programmable interconnect may take one of two forms, a first form, normally short circuited until rendered an open circuit as a result of a programming procedure, and a second form normally open circuited until rendered a short circuit as a result of a programming procedure.

The first form of one-time electrically programmable interconnect is usually referred to as fuse technology, and is exemplified by the disclosure found in U.S. Pat. No. 4,796,075 to Whitten. The second form of one-time electrically programmable interconnect is usually referred to as antifuse technology, and is exemplified by the disclosure found in U.S. Pat. No. 4,823,181 to Mohsen et al., U.S. Pat. No. 4,899,205 to Hamdy et al., and European Patent Application No. 90309731.9, Publication Number 0 416 903 A2, to Whitten et al.

While each form of one-time electrically programmable interconnect technology has been and continues to be useful in numerous integrated circuit applications, there remains room for improvement of this technology. For example, interconnect networks comprising fuse technology initially present a network of connected nodes. Fuses connecting unwanted circuit paths are then programmed by applying a voltage or current source across them. One disadvantage of this method is that other fuses in the interconnection network which are not to be programmed are in the current path of the fuse to be programmed. Depending on the configuration of the particular network, these "sneak" paths for current can be significant enough to require a large amount of current to be supplied to program the desired fuses. Typically, blocking diodes are employed to eliminate sneak paths. These devices require a semiconductor substrate in which to form the diode and add to the area and complexity of the integrated circuit device containing them.

When antifuse technology is used, care must be taken to avoid the inadvertent programming of antifuses which are intended to remain unprogrammed. In some cases, the existence of parallel current and voltage paths through the potential interconnection networks.raises the possibility of stressing antifuses which are to remain unprogrammed. Overly stressed antifuses may inadvertently become programmed, or may become so weakened that they will present a reliability problem and shorten the operating lifetime of the circuit in which they are used. This consideration necessitates careful design of the programming process and may also affect circuit design considerations.

It is an object of the present invention to provide an interconnection network for use in integrated circuits which minimizes or eliminates the disadvantages of fuse and antifuse based interconnection networks.

Another object of the present invention is to combine the advantages of antifuse and fuse devices in the same circuit.

It is a further object of the invention to provide a electrically programmable interconnect element which occupies a minimum area on a substrate material.

Yet another object of the present invention is to provide an electrically programmable interconnect element which may be programmed to either a high or low impedance condition.

BRIEF DESCRIPTION OF THE INVENTION

According to a presently preferred embodiment of the invention, a electrically programmable interconnect element is provided. The interconnect element of the present invention is like an antifuse but is capable of being programmed by a user to either a high or a low impedance condition.

The electrically programmable interconnect device of the present invention includes a first lower electrode comprising a conductive material. A layer of dielectric material is disposed over the top surface of the lower conductor. An antifuse material, such as one or more layers of a dielectric material, amorphous silicon, or combinations of such materials, is located in an aperture in the dielectric material where the interconnect element of the present invention is to be formed. A second, upper electrode of conductive material is formed over the top of the antifuse material. A portion of the upper electrode located immediately above the dielectric material is used as a fuse material. Electrical connections to circuitry incorporating the interconnect element of the present invention are made to the lower and upper electrodes.

In one embodiment of the present invention, a passivation layer covers the second electrode. In another embodiment of the invention, an aperture is located in the passivation layer immediately above the antifuse and fuse material.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
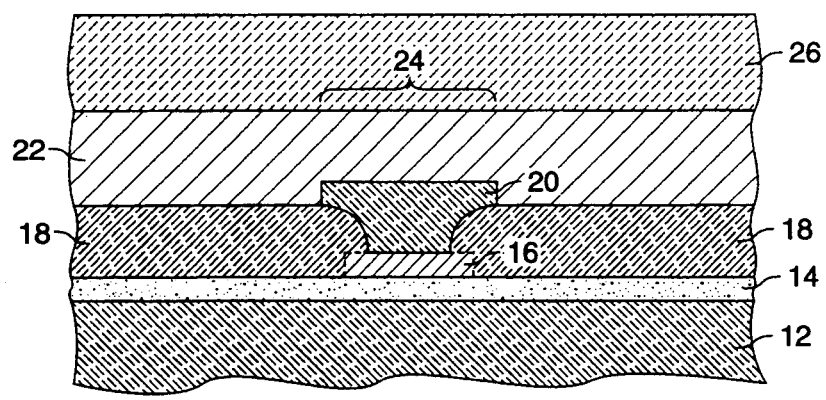
FIG. 1 is a cross-sectional view of a electrically programmable interconnect element according to a first embodiment of the invention.
Figure 2:
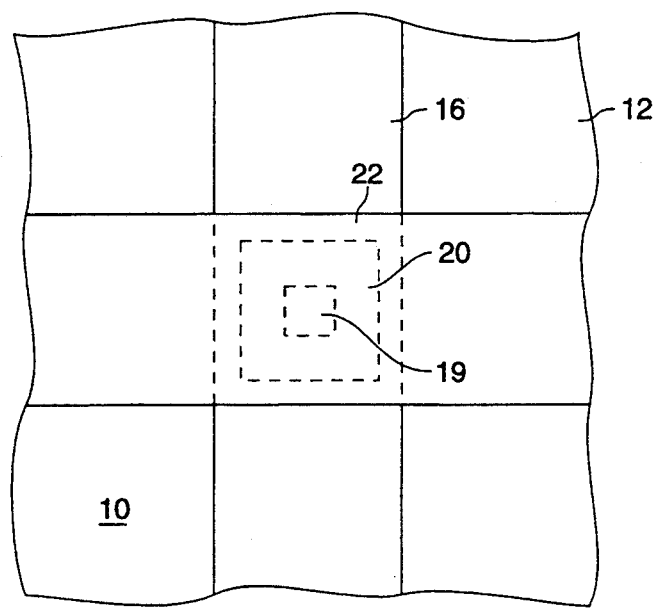
FIG. 2 is a top view of the electrically programmable interconnect element structure of FIG. 1.

Referring first to FIGS. 1 and 2, a first embodiment 10 of an electrically programmable interconnect element according to the present invention is fabricated on a substrate 12. Substrate 12 may be a semiconductor substrate such as is used for the fabrication of integrated circuits. Substrate 12 may also be formed of other materials, including, but not limited to metals and other conducting materials, and insulating materials, such as glass and ceramic materials. The choice of substrate material will be largely a matter on design choice dependent of the particular application, environment and other such considerations.

If substrate 12 is a conductive material or a semiconductor material, a dielectric layer 14 may be formed on the upper surface of substrate 12 for the purpose of electrically isolating electrically programmable interconnect element 10 from the substrate 12 and from other circuitry which may be contained thereon. Numerous materials are suitable for such a dielectric layer depending on the composition of substrate 12. For example, if substrate 12 is a silicon semiconductor substrate, dielectric layer 14 may be a layer of silicon dioxide. Those of ordinary skill in the art will readily be able to select an appropriate material for dielectric layer 14. The thickness of dielectric layer 14 should be chosen to assure that this layer will provide electrical insulation of interconnect element 10 from a conductive or semiconductor substrate.

A lower, first electrode 16 for interconnect element 10 is formed on the surface of dielectric layer 14 (or may be formed directly on the surface of substrate 12 if substrate 12 is formed from an insulating material). Lower electrode 16 may be a metal layer formed using conventional materials processing techniques. In a presently preferred embodiment, lower electrode 16 may be formed from a layer of aluminum having a thickness of about 2 microns, and a layer of titanium-tungsten having a thickness of about 0.2 microns. Those of ordinary skill in the art will recognize that in instances where substrate 12 is a semiconductor substrate, the lower electrode 16 may be a doped region in substrate 12 as shown in FIG. 1c formed using conventional-semiconductor processing steps.

A dielectric layer 18 is disposed over lower electrode 16. Dielectric layer 18 may be formed from a variety of materials, including silicon dioxide and other known dielectric materials. The purpose of dielectric layer is to separate lower electrode 16 from the other conductive members of interconnect element 10. In a presently preferred embodiment, dielectric layer 18 may be a layer of silicon dioxide having a thickness of about 2 microns.

An aperture 19 is formed in dielectric layer 18 in a region overlying lower electrode 16 where interconnect element 10 is to be formed and an antifuse material 20 is formed in the aperture. Antifuse material 20 is characterized by a high impedance but can be programmed to exhibit a low impedance by application of a suitable programming voltage. There are numerous antifuse materials available for use as antifuse element 20, including, but not limited to amorphous silicon, silicon dioxide and silicon nitride dielectric materials, or combinations of these materials. In a presently preferred embodiment of the invention, antifuse material 20 comprises amorphous silicon having a thickness of about between 0.2 to 1 micron. It is also feasible to reverse the order of layers 18 and 20, such that layer 20 is deposited and patterned prior to layer 18.

Figure 3:
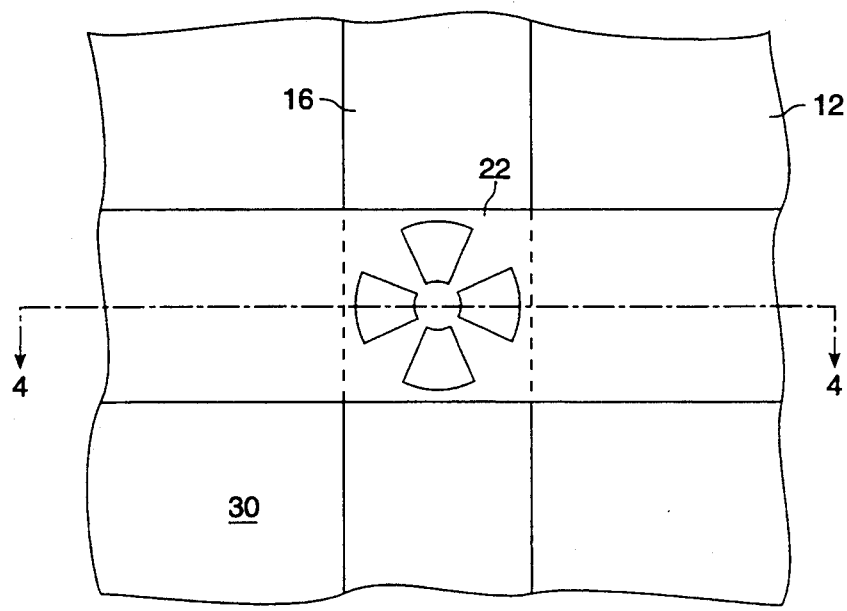
FIG. 3 is a top view of an alternate embodiment of the electrically programmable interconnect element of FIG. 1, having a differently configured fuse element portion.

An upper electrode 22 for interconnect element 10 is formed over dielectric layer 18 and antifuse material 20. Upper electrode 22 may be formed from conductive materials such as aluminum, titanium-tungsten, molybdenum, or copper. In a presently preferred embodiment, upper electrode 22 is formed from a layer of titanium tungsten having a thickness of about 0.2 microns and a layer of aluminum having a thickness of about between 0.2 to 2 microns. At least region 24 of upper electrode 22 is formed from a fuse material chosen such that it is susceptible to disruption within an operable range of programming current as will be more fully explained herein. Fuse portion 24 comprises the region of upper electrode 22 directly above antifuse material 20 in aperture 19 in lower dielectric 18 as is shown in FIG. 2. As those of ordinary skill in the art will appreciate, fuse portion 24 could also take other forms. For instance, the portion of the layer comprising fuse portion 24 could be patterned and etched to include voids. Such an embodiment is shown in FIG. 3. Alternatively, the layer could include a necked-down or thinned portion of the upper electrode 22 to comprise fuse portion 24. In a presently preferred embodiment, region 24 comprises a layer of TiW without voids.

Where a plurality of electrically programmable elements according to the invention are to be formed, upper and lower conductors 16 and 22 may be layed out as one or more intersecting strips, with interconnect elements 10 formed at the intersections. One such intersection, with its interconnect element disposed therein, is shown in top view in FIG. 2.

A passivation layer 26 may be formed over the top surface of upper electrode 22 as is known in the art from any one of a number of materials known to be suitable for that purpose. Using well known materials and techniques, electrical connections from lower electrode 16 and upper electrode 22 may be made to other circuit elements or other interconnect elements in the electrical circuit containing interconnect element 10.

The device described above operates as a multi-state switch. Initially, the device is in a high impedance state (i.e., about 1 Gohm) but can be switched to a low impedance state by the application of a switching voltage and a first programming current. The device can also be switched again to a high impedance state (open) by the application of a second programming current higher than the first programming current. The switching voltage is used to trigger the change from the initial high impedance state and the magnitude of the first programming current controls the valu of the final resistance.

For example, a device fabricated with 6,000 Å of amorphous silicon will have a switching voltage of about 50 volts and can be programmed down to about 5 ohms with a current of about 200 mA. The switching voltage is proportional to the thickness of the amorphous silicon layer and the final resistance is inversely proportional to the programming current. The final high impedance state can be obtained with or without the intermediate low impedance state, however, very low impedances require high power to reprogram the device to the open state. For the device shown in FIG. 2, having 2,000 Å of TiW, 1 micron of aluminum for layer 22, and 1 micron of PECVD oxide dielectric for layer 26, the second programming current required to re-open the device from a yesistance of about 400 Ω is about 2A. This current roughly scales with the thickness and mechanical strength of the metal and passivation dielectric above the programmable device.

Those of ordinary skill in the art will recognize that interconnect element 10 may be analyzed as if it were an antifuse element in series with a fuse element. Interconnect element 10 may be fabricated as a compact vertical structure. By locating the fuse portion directly over the antifuse portion, interconnect element 10 may occupy a minimal amount of area. In its unprogrammed state, the interconnect element 10 of the present invention exhibits a high impedance (typically on the order of about $1 \times 10^9$ ohms) and may be programmed to exhibit either low impedance or high impedance.

Interconnect element 10 may be programmed to a low impedance state by programming its antifuse portion. Typical antifuse programming mechanisms are involved in programming the antifuse portion of the interconnect element 10 of the present invention and include placing a programming voltage $V_{pp}$ across the lower electrode 16 and upper electrode 22 of interconnect element 10. Programming voltage $V_{pp}$ should have a magnitude sufficient to rupture or otherwise disrupt the antifuse material 20 in order to provide a conductive path 27 therethrough. In the example of the preferred embodiment of interconnect element 10 disclosed in conjunction with FIGS. 1 and 2, programming voltage Vpp Can be any voltage in the range of from about 15 to 100 volts, depending on such factors as antifuse material thickness. For example, where layer 20 is an amorphous silicon layer 2,000 Å thick, the programming voltage is about 15 volts.

Figure 1A:
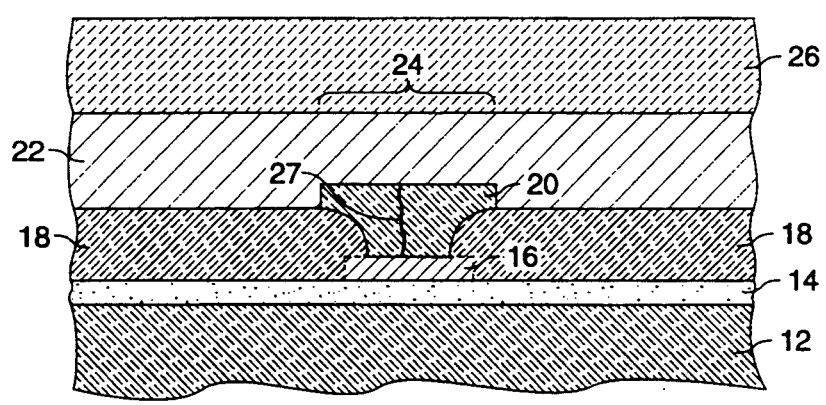
FIG. 1A is a cross-sectional view of an electrically programmable interconnect element programmed to a low-impedance condition according to a first preferred embodiment of the present invention.

FIG. 1A depicts conductive path or "filament" 27 referred to above linking electrodes 16 and 22.

After programming interconnect element 10 to a low impedance state, it may be further programmed to a high impedance state by programming its fuse element portion. As will be understood by those of ordinary skill in the art, the fuse portion of interconnect element 10 may be programmed to a high impedance state by passing a programming current $I_{fuse}$ between the lower electrode 16 and upper electrode 22 of interconnect element 10. Programing current Ifuse should have a magnitude sufficient to cause disruption of the conductive material forming region 24 of upper conductor 22. See 29 in FIG. 1B. In the example of the preferred embodiment of interconnect element 10 disclosed in conjunction with FIGS. 1 and 2, programming current $I_{fuse}$ should be in the range of from about 1–4 amps.

Figure 1B:
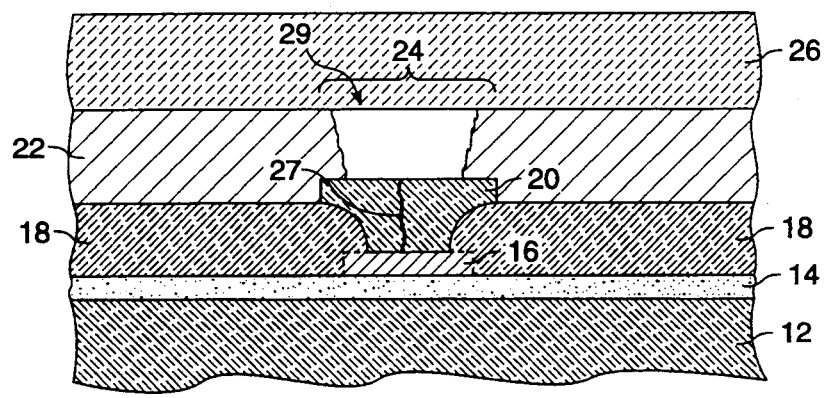
FIG. 1B is a cross-sectional view of an electrically programmable interconnect element first programmed to a low-impedance condition and subsequently programmed to a high-impedance condition according to a first preferred embodiment of the present invention.
Figure 1C:
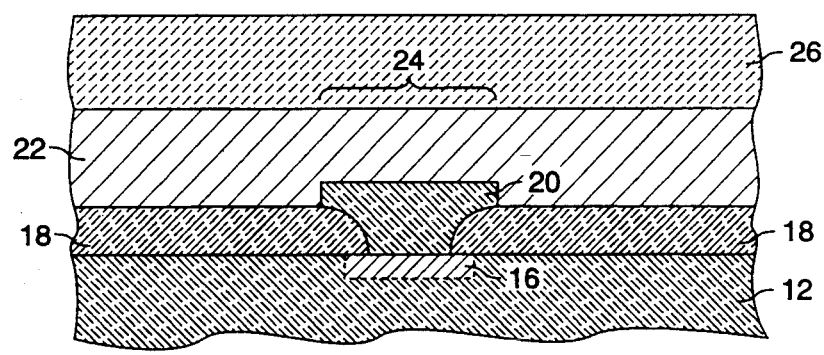
FIG. 1C is a cross-sectional view of an electrically programmable interconnect element where the lower conductive electrode is a doped region 16 within a semiconductor substrate 12.

FIG. 1B depicts disrupted region 29 referred to above which impedes current flow between conductive path 27 and electrode 22.

The materials from which the antifuse material 20 and region 24 of upper conductor 22 are formed, and their thicknesses should be chosen to allow the antifuse portion of interconnect element 10 to be programmed to a sufficiently low final resistance using a value of current safely below that of $I_{fuse}$. The final resistance of the antifuse is proportional to the thickness of the antifuse material, and the thickness of region 24 is roughly proportional to $I_{fuse}$. Choosing an adequate margin will assure prevention of inadvertent programming of the fuse element portion of interconnect element 10 during the programming cycle of its antifuse portion.

Those of ordinary skill in the art can appreciate that use of interconnection element 10 in an integrated circuit or other similar circuit structure containing a plurality of interconnection elements overcomes the problems inherent in both prior art antifuse and fuse element interconnection elements. First, since all antifuse elements on the integrated circuit can be programmed to either a shorted or an open state, the problems usually encountered by overstressing antifuses which are to remain unprogrammed do not exist. Second, because, unlike fuse elements, all interconnection elements 10 according to the present invention are initially open circuits, the programming of the first interconnection element may be accomplished without large amounts of current being drawn from the programming voltage source by parasitic current paths through other unprogrammed interconnection elements.

Figure 4:
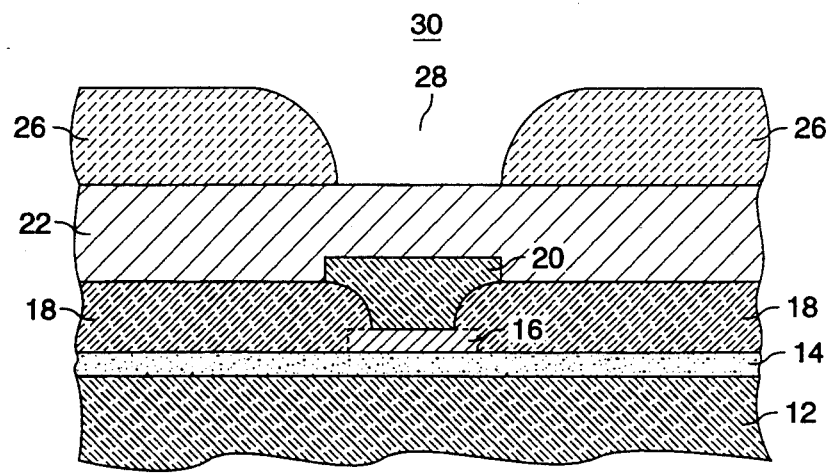
FIG. 4 is a cross sectional view of an electrically-programmable interconnect element according to a second embodiment of the invention.
Figure 5:
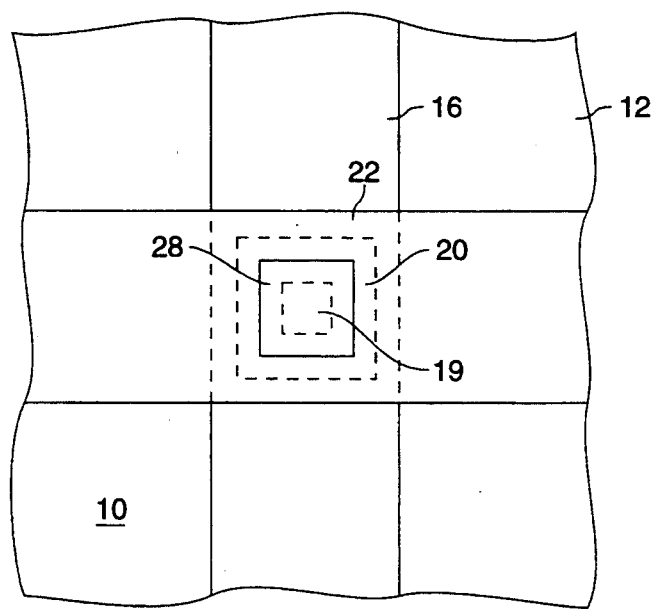
FIG. 5 is a view of the electrically programmable interconnect element structure of FIG. 4.

One example of an alternative embodiment of the present invention is shown in cross section in FIG. 4 and top view in FIG. 5. For ease of figure comparison, like reference numerals are used for like elements in the figures herein.

Electrically programmable interconnect element 30 is fabricated on a substrate 12. Like the embodiment of FIGS. 1 and 2, substrate 12 may be a semiconductor substrate such as is used for the fabrication of integrated circuits or may also be formed of other materials.

If substrate 12 is a conductive material or a semiconductor material, a dielectric layer 14 may be formed on the upper surface of substrate 12 for the purpose of electrically isolating electrically programmable interconnect element 30 from the substrate 12 and from other circuitry which may be contained thereon.

The remainder of the structure of interconnect element 30 is similar to that of FIGS. 1 and 2. A lower, first electrode 16 for interconnect element 30 is formed on the surface of dielectric layer 14 (or may be formed directly on the surface of substrate 12 if substrate 12 is formed from an insulating material. A dielectric layer 18 is disposed over lower electrode 16. An aperture is formed in dielectric layer 18 in a region overlying lower electrode 16 where interconnect element 30 is to be formed and an antifuse material 20 is formed in the aperture. An upper electrode 22 for interconnect element 30 is formed over dielectric layer 18 and antifuse material 20. At least region 24 of upper electrode 22 is formed from a fuse material chosen such that it is susceptible to disruption within an operable range of programming current and has similar features as the embodiment shown in FIGS. 1 and 2. Numerous fuse materials are known in the art and may be employed in the present invention.

As in the embodiment illustrated in FIGS. 1 and 2, a passivation layer 26 may be formed over the top surface of upper electrode 22 of interconnect element 30 of FIGS. 4 and 5. However, unlike the embodiment in FIGS. 1 and 2, an aperture 28 is formed in passivation layer 26 immediately above fuse element portion 24 of upper conductor 22. For the device shown in FIG. 4 with 2,000 Å of TiW and 1 micron of aluminum for layer 22, the second programming current required to re-open the device from a resistance of about 300 Å is about 2 amps.

Figure 6:
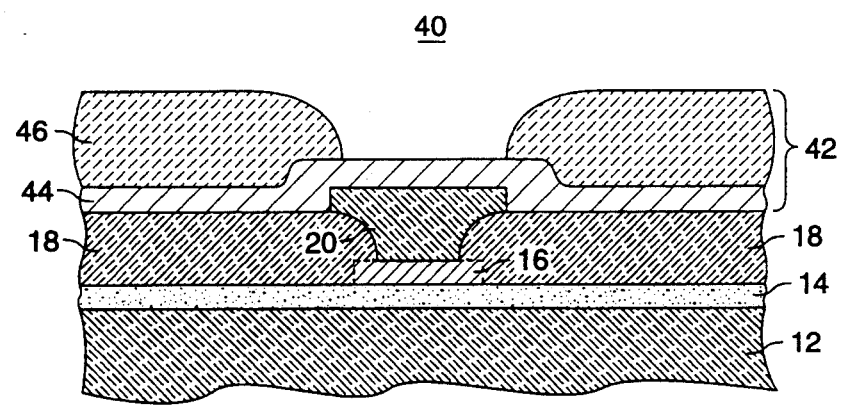
FIG. 6 is a cross sectional view of an electrically programmable interconnect element according to a third embodiment of the FIG. 7 is a top view of the electrically programmable interconnect element structure of FIG. 6.
Figure 7:
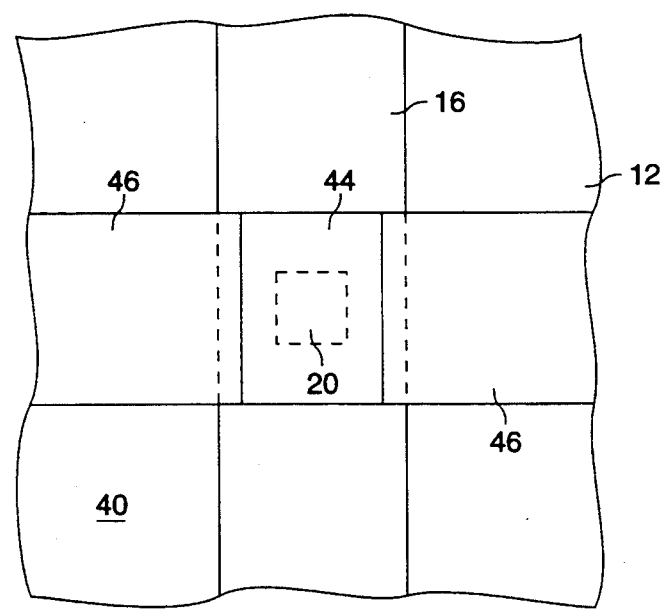

Other embodiments of the present invention are possible. Referring now to FIGS. 6 and 7, an interconnect element according to the present invention is depicted in cross-sectional and top views, respectively. Interconnect element 40 according to the present invention is shown disposed on a substrate 12.

If substrate 12 is a conductive material or a semiconductor material, a dielectric layer 14 may be formed on the upper surface of substrate 12 for the purpose of electrically isolating user-programmable interconnect element 40 from the substrate 12 and from other circuitry which may be contained thereon.

A lower, first electrode 16 for interconnect element 40 is formed on the surface of dielectric layer 14 (or may be formed directly on the surface of substrate 12 if substrate 12 is formed from an insulating material. A dielectric layer 18 is disposed over lower electrode 16. An aperture is formed in dielectric layer 18 in a region overlying lower electrode 16 where interconnect element 40 is to be formed and an antifuse material 20 is formed in the aperture.

An upper electrode 42 for interconnect element 40 is formed over dielectric layer 18 and antifuse material 20. In the embodiment of FIGS. 6 and 7, upper electrode 42 includes fuse element portion 44, which may be formed from a fuse material chosen such that it is susceptible to disruption within an operable range of programming current. In a presently preferred embodiment of the invention, fuse element layer 44 may be formed from a layer of titanium-tungsten having a thickness of about 2,000 Å. Other possible materials may comprise a wide range of materials, e.g., aluminum, molybdenum, copper, or combinations of these materials.

An additional conductive layer 46 is placed over fuse element layer 44. In a presently preferred embodiment of the invention, additional conductive layer 46 may be formed from a layer of aluminum having a thickness of about 2 microns, although any conductive material compatible with the process conditions may be used.

As in the previously-illustrated embodiments of the present invention, a passivation layer 26 may be formed over the top surface of upper electrode 42 of interconnect element 40, and may or may not include aperture 28 located over the interconnect element. For the device shown in FIG. 7 with 2,000 Å of TiW for layer 44 and 1 micron of aluminum for layer 46, and the entire device covered with 1 micron of PECVD oxide dielectric, the second programming current required to re-open the device from a resistance of about 2 Ω is about 1.5 amps. The second programming current required to re-open the device from a resistance of about 5 Ω is about 1 amp.

The interconnect element of present invention may be fabricated using well-known semiconductor and materials processing techniques. According to a presently preferred embodiment of the invention, the interconnect element of the present invention may be fabricated on a substrate 12 formed from a semiconductor material, or from a ceramic, glass or metal material.

If a semiconductor substrate is employed, a first dielectric layer 14 is formed over the surface of the substrate. In a presently preferred embodiment of the invention, the first dielectric layer may be an oxide formed to a thickness of about between 1–10 microns using PECVD techniques with silane and argon. A thermal oxide or polyimide layer may also be employed.

A first metal layer, preferably formed from sputter deposited aluminum to a thickness of about 1 micron is formed over the surface of the dielectric layer. First metal layer could also be formed from Cu or Au, or other conductors.

A second metal layer, preferably about 0.2 microns of sputter deposited TiW, is next deposited over the first metal layer. The second metal layer could also be formed from Cr, Ni, Mo, Ta, etc.

Next, the first and second metal layers are defined into a lower electrode 16 for the interconnect element of the present invention. These steps may be performed using conventional photolithography and metal etching techniques. Alternatively, the metal patterning can be done using an additive process by sputter depositing a seed layer (e.g., Cr), defining a metal pattern in photoresist, plating the metal lines, removing the photoresist, and completing the metal patterning by removing the seed layer.

A second dielectric layer 18, preferably a PECVD oxide layer like the first dielectric layer and having a thickness of about 1 micron, is next formed over the defined first and second metal layers. This layer could also be a thermal oxide or polyimide layer.

Next, conventional photolithography and etching steps are performed to open a via in dielectric layer 18 for the interconnect element of the present invention. A typical via size is 4 microns, however, other sizes are possible.

The layer of antifuse material 20, preferably amorphous silicon, is next formed. It is preferred to use PECVD techniques in an atmosphere of silane and argon. Alternatively, this layer could be formed using CVD or sputtering techniques.

A third metal layer, preferably comprising TiW is deposited in the same manner as the first TiW layer, followed by deposition of a fourth metal layer, preferably aluminum formed in the manner in which the first aluminum layer was formed. The third and fourth metal layers are together defined using conventional photolithography and etching techniques to comprise upper electrode 22 of the interconnect element of the present invention. The etching step employed also forms the pattern for the fuse element portion of the interconnect element of the present invention.

A passivation layer 26, preferably an oxide having a thickness on the order of 1 micron is next formed over the entire structure. The passivation layer 26 could also be a oxide and nitride or a polyimide layer. The passivation layer 26 may then be masked and etched in the region over antifuse material 20 using conventional photolithography and etching techniques to open an aperture above the interconnect element structure.

If the embodiment shown in FIGS. 6 and 7 is being fabricated, the first TiW portion 44 of the upper electrode 42 is deposited, followed by the second portion 46 of the upper electrode. In this embodiment, second portion 46 of the upper electrode is subjected to an additional etching step to expose first portion 44 in the region above antifuse material 20. These steps may then be followed by the steps to form and etch the passivation layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A three-state, two terminal electrically programmable interconnect element, said interconnect element initially having a first hiqh impedance state and being programmable from said first state to either a second low impedance state or a third non-volatile hiqh impedance state, and being programmable from said second state to said third high impedance state, said interconnect element comprising:
   a first terminal including a first conductive electrode;
   an insulating layer disposed over said first conductive electrode having an aperture formed therein;
   an antifuse material layer disposed in said aperture and adapted to become conductive upon application of a selected programming voltage across said first terminal and a second terminal;
   said second terminal including a second conductive electrode disposed over said insulating layer and said antifuse material layer, said second conductive electrode having a first portion having a first thickness and a second portion having a second thickness less than said first thickness, said second portion disposed over said aperture;
   said second portion of said second conductive electrode adapted to disrupt and become nonconductive in response to application of a selected programming current across said first and second terminals.

2. An electrically programmable interconnect element according to claim 1 wherein said second portion of said second conductive electrode is located directly over and physically adjacent to said aperture.

3. A three-state, two-terminal electrically programmable interconnect element, said interconnect element initially having a first high impedance state and being programmable from said first state to either a second low impedance state or a third non-volatile high impedance state, and being programmable from said second state to said third high impedance state, said interconnect element comprising:
   a first terminal including a first conductive electrode, said first conductive electrode having a first portion having a first thickness and a second portion having a second thickness less than said first thickness;
   an insulating layer disposed over said first conductive electrode having an aperture formed therein;
   an antifuse material layer disposed in said aperture and adapted to become conductive upon application of a selected programming voltage across said first terminal and a second terminal;
   said second terminal including a second conductive electrode disposed over said insulating layer and said antifuse material layer;
   said second portion of said first conductive electrode adapted to disrupt and become nonconductive in response to application of a selected programming current across said first and second terminals.

4. An electrically programmable interconnect element according to claim 3 wherein said second portion of said first conductive electrode is located directly under and physically adjacent to said aperture.

5. An electrically programmable interconnect element according to claim 1 wherein said first conductive electrode is a doped region within a semiconductor substrate.

6. An electrically programmable interconnect element according to claim 3 wherein said first conductive electrode is a doped region within a semiconductor substrate.

7. An electrically programmable interconnect element according to claim 1 wherein said first conductive electrode is a conductive layer disposed over a substrate.

8. An electrically programmable interconnect element according to claim 3 wherein said first conductive electrode is a conductive layer disposed over a substrate.

9. An electrically programmable interconnect element according to claim 1 further comprising a passivation layer disposed over said second conductive electrode.

10. An electrically programmable interconnect element according to claim 3 further comprising a passivation layer disposed over said second conductive electrode.

11. An electrically programmable interconnect element according to claim 9 wherein said passivation layer further comprises an opening located directly above said aperture.

12. An electrically programmable interconnect element according to claim 10 wherein said passivation layer further comprises an opening located directly above said aperture.

13. An electrically programmable interconnect element according to claim 1 wherein said first conductive electrode comprises titanium tungsten having a thickness of about 2,000 Å and said second conductive layer comprises aluminum.

14. An electrically programmable interconnect element according to claim 3 wherein said first conductive electrode comprises titanium tungsten wherein said first thickness is about 2,000 Å and said second conductive layer comprises aluminum.

15. An electrically programmable interconnect element according to claim 1 wherein said first conductive electrode comprises chromium having a thickness of about 400 Å and said second conductive electrode comprises copper.

16. An electrically programmable interconnect element according to claim 3 wherein said first conductive electrode comprises chromium wherein said first thickness is about 400 Å and said second conductive electrode comprises copper.

17. A programmed three-state, two terminal electrically programmable interconnect element, said interconnect element initially having a first high impedance state and initially being programmable from said first state to either a second low impedance state or a third non-volatile high impedance state, and being programmable from said second state to skid third high impedance state, said interconnect element programmed to its second state and comprising:
   a first terminal including a first conductive electrode;
   an insulating layer disposed over said first conductive electrode having an aperture formed therein;
   an antifuse material layer disposed in said aperture and adapted to become conductive upon application of a selected programming voltage across said first terminal and a second terminal, said antifuse material layer further including conductive links forming a short circuit condition between said first terminal and said second terminal;
   said second terminal including a second conductive electrode disposed over said insulating layer and said antifuse material layer, said second conductive electrode having a first portion having a first thickness and a second portion having a second thickness less than said first thickness, said second portion disposed over said aperture;
   said second portion of said second conductive electrode adapted to disrupt and become non-conductive in response to application of a selected programming current across said first and second terminals thus providing a non-volatile open circuit between said first and second terminals.

18. A programmed three-state, two terminal electrically programmable interconnect element, said interconnect element initially having a first high impedance state and initially being programmable from said first state to either a second low impedance state or a third non-volatile high impedance state, and being programmable from said second state to said third high impedance state, said interconnect element programmed to its second state and comprising:
   a first terminal including a first conductive electrode, said first conductive electrode having a first portion having a first thickness and a second portion having a second thickness less than said first thickness;
   an insulating layer disposed over said first conductive electrode having an aperture formed therein;
   an antifuse material layer disposed in said aperture and adapted to become conductive upon application of a selected programming voltage across said first terminal and a second terminal, said antifuse material layer further including conductive links forming a short circuit condition between said first terminal and said second terminal;
   said second terminal including a second conductive electrode disposed over said insulating layer and said antifuse material layer;
   said second portion of said first conductive electrode adapted to disrupt and become non-conductive in response to application of a selected programming current across said first and second terminals thus providing a non-volatile open circuit between said first and second terminals.

19. A programmed three-state, two terminal electrically programmable interconnect element, said interconnect element initially having a first high impedance state and initially being programmable from said first state to either a second low impedance state or a third non-volatile high impedance state, and being programmable from said second state to said third high impedance state, said interconnect element programmed to its third state and comprising:
   a first terminal including a first conductive electrode;
   an insulating layer disposed over said first conductive electrode having an aperture formed therein;
   an antifuse material layer disposed in said aperture and disrupted as a result of application of a selected programming voltage across said first terminal and a second terminal;
   said second terminal including a second conductive electrode disposed over said insulating layer and said antifuse material layer, said second conductive electrode having a first portion having a first thickness and a second portion having a second thickness less than said first thickness, said second portion disposed over said aperture;
   said second portion of said second conductive electrode disrupted in response to the disruption of said antifuse material layer and thus providing a non-volatile open circuit across said first and second terminals.

20. A programmed three-state, two terminal electrically programmable interconnect element, said interconnect element initially having a first high impedance state and initially being programmable from said first state to either a second low impedance state or a third non-volatile high impedance state, and being programmable from said second state to said third high impedance state, said interconnect element programmed to its third state and comprising:
   a first terminal including a first conductive electrode, said first conductive electrode having a first portion having a first thickness and a second portion having a second thickness less than said first thickness;
   an insulating layer disposed over said first conductive electrode having an aperture formed therein;
   an antifuse material layer disposed in said aperture and disrupted as a result of application of a selected programming voltage across said first terminal and a second terminal;
   said second terminal including a second conductive electrode disposed over said insulating layer and said antifuse material layer;
   said second portion of said first conductive electrode disrupted in response to the disruption of said antifuse material layer and thus providing a non-volatile open circuit across said first and second terminals.

21. A three-state, two terminal electrically programmable interconnect element, said interconnect element initially having a first high impedance state and being programmable from said first state to either a second low impedance state or a third non-volatile high impedance state, and being programmable from said second state to said third high impedance state, said interconnect element comprising:

a first terminal including a first conductive electrode;

an insulating layer disposed over said first conductive electrode having an aperture formed therein;

an antifuse material layer disposed in said aperture and adapted to become conductive upon application of a selected programming voltage across said first terminal and a second terminal;

said second terminal including a second conductive electrode disposed over said insulating layer and said antifuse material layer, said second conductive electrode having a plurality of interstices therethrough, said interstices disposed at least partially over said aperture;

said second conductive electrode adapted to disrupt in the area over said aperture in response to application of a selected programming current across said first and second terminals resulting in a non-volatile open circuit across said first and second terminals.

22. A three-state, two terminal electrically programmable interconnect element, said interconnect element initially having a first high impedance state and being programmable from said first state to either a second low impedance state or a third non-volatile high impedance state, and being programmable from said second state to said third high impedance state, said interconnect element comprising:

a first terminal including a first conductive electrode;

an insulating layer disposed over said first conductive electrode having an aperture formed therein;

an antifuse material layer disposed in said aperture and adapted to become conductive upon application of a selected programming voltage across said first terminal and a second terminal;

said second terminal including a second conductive electrode disposed over said insulating layer and said antifuse material layer;

said first conductive electrode having a plurality of interstices therethrough, said interstices disposed at least partially under said aperture;

said first conductive electrode adapted to disrupt in the area under said aperture in response to application of a selected programming current across said first and second terminals resulting in a non-volatile open circuit across said first and second terminals.

23. A three-state, two terminal electrically programmable interconnect element, said interconnect element initially having a first high impedance state and being programmable from said first state to either a second low impedance state or a third non-volatile high impedance state, and being programmable from said second state to said third high impedance state, said interconnect element comprising:

a first terminal including a first conductive electrode;

an insulating layer disposed over said first conductive electrode having an aperture formed therein;

an antifuse material layer disposed in said aperture and adapted to become conductive upon application of a selected programming voltage across said first terminal and a second terminal;

said second terminal including a second conductive electrode disposed over said insulating layer and said antifuse material layer; and a passivation layer disposed over said second terminal having an opening therein disposed directly over said aperture to assist in the rupture of at least one of said first conductive electrode and said second conductive electrode.

* * * * *

UNITED STATES PATENT AND TRADEMARK OFFICE
CERTIFICATE OF CORRECTION

PATENT NO. : 5,451,811
DATED : September 19, 1995
INVENTOR(S) : Ralph Whitten, et al.

It is certified that error appears in the above-indentified patent and that said Letters Patent is hereby corrected as shown below:

Column 1, line 14, replace "BACKGROUND OF THE INVENTIQN" with —BACKGROUND OF THE INVENTION—.
Column 1, line 11, replace "Field" with —Field—.
Column 2, line 27, delete "." after "networks".
Column 2, line 43, replace "a" with —an—.
Column 2, line 53, replace "a" with —an—.
Column 3, line 12, replace "a" with —an—.
Column 3, line 42, after "the" insert—invention employing a multi-layer upper electrode—.
Column 3, line 61, replace "of" with —on—.
Column 4, line 26, replace "FIG. 1c" with —FIG. 1C—.
Column 4, line 26, delete "-" after "conventional".
Column 5, line 34, replace "valu" with —value—.
Column 5, line 49, replace "yesistance" with —resistance—.
Column 6, line 9, replace "Vpp" with —$V_{pp}$—.
Column 6, line 9, replace "Can" with —can—.
Column 6, line 24, replace "Ifuse" with —$I_{fuse}$—.
Column 7, line 40, replace "Å" with —$\Omega$—.

Signed and Sealed this

Twentieth Day of February, 1996

Attest:

BRUCE LEHMAN

*Attesting Officer*    Commissioner of Patents and Trademarks